United States Patent [19]

Sangouard

[11] Patent Number: 5,086,009
[45] Date of Patent: Feb. 4, 1992

[54] METHOD FOR EMBODYING AN ACTIVE MATRIX FLAT SCREEN AND A RAM MEMORY USING MIM COMPONENTS

[75] Inventor: Patrick Sangouard, Villiers Sur Marne, France

[73] Assignee: Chambre de Commerce et d'Industrie de Paris, Paris, France

[21] Appl. No.: 454,758

[22] Filed: Dec. 21, 1989

[30] Foreign Application Priority Data

Dec. 27, 1988 [FR] France .................. 88 17246

[51] Int. Cl.⁵ ................. H01L 21/44; H01L 21/84; H01L 29/00
[52] U.S. Cl. .................... 437/48; 437/49; 437/101; 437/189; 437/195; 437/238; 357/23.6; 357/4; 357/2; 359/54; 359/79
[58] Field of Search ............ 437/101, 48, 49, 189, 437/919, 195, 235, 238; 357/2, 4, 23.6, 23.7; 350/333, 334, 339 R; 148/DIG. 14

[56] References Cited

U.S. PATENT DOCUMENTS

| 4,523,623 | 8/1985 | Araki | 350/339 R |
|---|---|---|---|
| 4,523,811 | 6/1985 | Ota | 350/339 R |
| 4,683,183 | 7/1987 | Ono | 350/334 |
| 4,689,116 | 8/1987 | Coissard et al. | 350/333 |
| 4,828,370 | 5/1989 | Suzuki | 350/339 R |
| 4,838,656 | 6/1989 | Stoddard | 350/333 |
| 4,842,372 | 6/1989 | Toyoma | 350/339 R |
| 4,907,040 | 3/1990 | Kobayashi et al. | 357/2 |

FOREIGN PATENT DOCUMENTS

| 0038920 | 2/1988 | Japan | 350/339 R |
|---|---|---|---|
| 0253332 | 10/1988 | Japan | 350/339 R |
| 2091468 | of 0000 | United Kingdom . | |

OTHER PUBLICATIONS

Mimura et al., "SOI TFT's With Directly Contacted ITO", IEEE Electron Device Letters, vol. EDL-7, No. 2, Feb. 1986, pp. 134-136.

Primary Examiner—Olik Chaudhuri
Assistant Examiner—M. Wilczewski
Attorney, Agent, or Firm—Pearne, Gordon, McCoy & Granger

[57] ABSTRACT

Method for the embodiment of a flat active matrix screen and a RAM memory using MIM components.

The method of the invention includes the following operations:

a stacking is formed of a first material, namely an oxidizing conductor, and a second material, namely an oxidizable conductor and preferably a semiconductor, this stacking is heated to a temperature suitable for provoking an oxidation-reduction between the two materials, which forms an interposed insulating film, this stacking is cooled to ambient temperature.

Application for electronics concerning the embodiment of active matrix liquid crystals display screens or dynamic RAM memories.

10 Claims, 7 Drawing Sheets

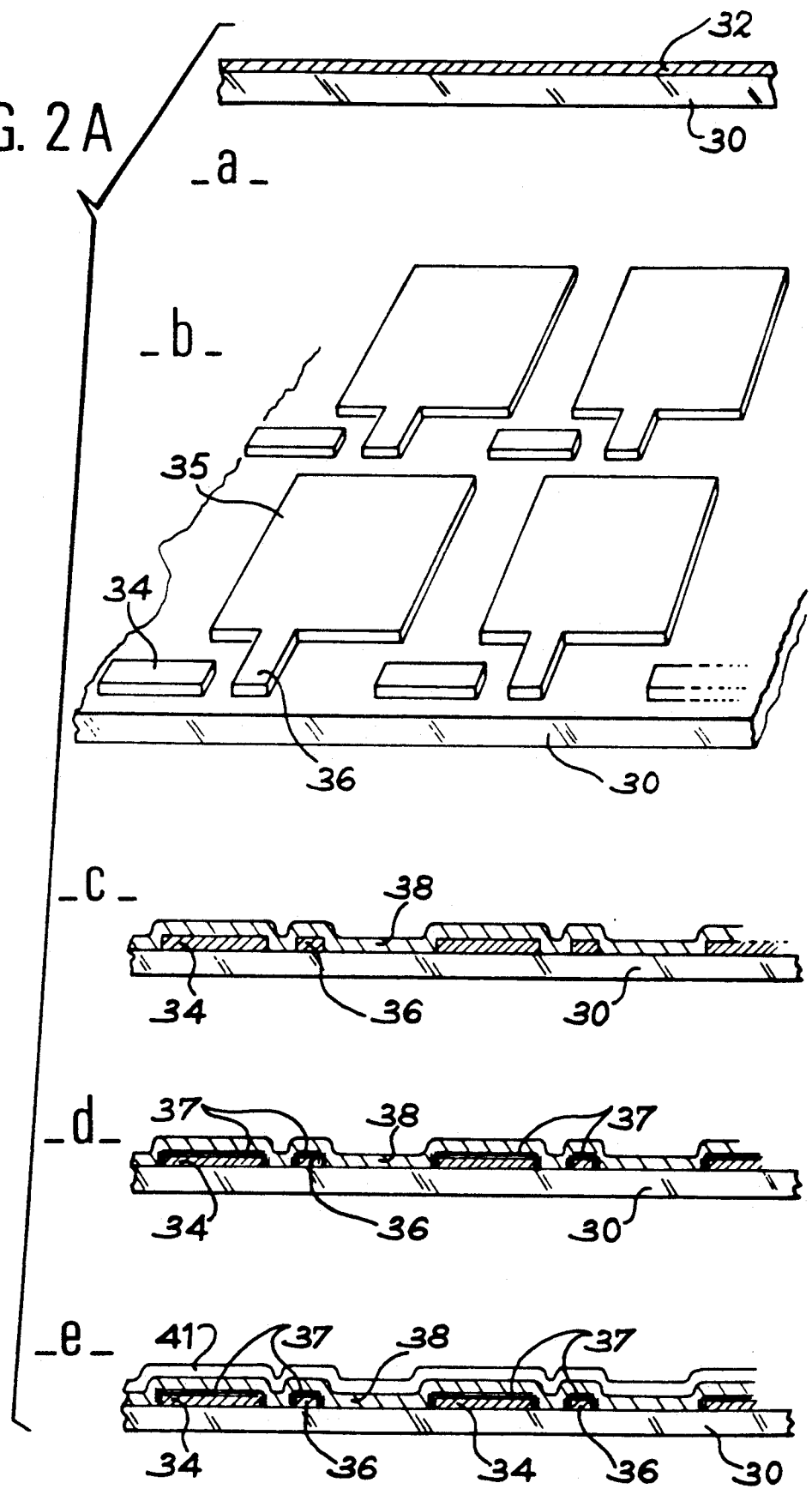

_a_

_b_

METHOD FOR EMBODYING AN ACTIVE MATRIX FLAT SCREEN AND A RAM MEMORY USING MIM COMPONENTS

FIELD OF THE INVENTION

The object of the present invention is to provide a method to embody an active matrix flat screen and a RAM memory using MIM components.

BACKGROUND OF THE INVENTION

In particular, the invention can be applied for display as regards the embodiment of active matrix type liquid crystals flat screens and can be used in data processing applications for the embodiment of dynamic RAM type memories (direct access memory).

So as to set forth the problems able to be resolved by the invention, first of all there follows an example of the invention. However, it goes without saying that this example is not restrictive and RAM type memories are not excluded from the invention.

There currently exist a large number of types of liquid crystal display screens. The screen to be embodied envisaged by the present invention is an active matrix type screen. One advantageous embodiment method is the two masking level method referred to in the document FR-A-2 533 072. This method makes it possible to associate with each pixel a thin film transistor (TFT) whose grid is connected to an addressing line, the source being connected to a column and the drain to the electrode of the pixel.

One active matrix display screen is also described in the article entitled "SOI TFT's with Directly Contacted ITO" published by AKIO MIMURA et al. in IEEE Electron Device Letters, vol. EDL-7, n° 2, February 86, pages 134-136.

There also currently exist other screens in which the switching element is not a TFT but a non-linear element. The general diagram of such a device is shown on FIG. 1. This figure shows the addressing columns $C_j$ and the capacitors $C_{ij}$ having a first armature or electrode el, this electrode being connected to the adjacent column through a non-linear element $S_{ij}$, all the above being disposed on a first plate (not shown). The second armatures or counter-electrodes cel are connected to addressing lines $L_i$ borne by a second plate (not shown).

The application of selected voltages to the lines $L_i$ and the columns $C_j$ makes it possible to charge or discharge the capacitor $C_{ij}$ through the element $S_{ij}$. The resultant electric field makes it possible to control the optical state of the liquid crystal present between the two plates and thus display one point ("pixel") of an image.

The document GB-A-2 091 468 describes such a device and an embodiment method where the non-linear element $S_{ij}$ is an MIM component, that is a metal/insulant/metal stacking.

In the document GB-A-2 091 468, the MIM components are obtained by depositing a first metallic film, anodization producing a film of oxide, followed by the depositing of a second metallic film on the oxide.

Such a technique has a large number of drawbacks:

first of all, this technique requires four masking levels and photolithoengraving, which heavily adversely affects production efficiency which exponentially decreases with the number of levels, then, recourse to the anodic oxidation phenomenon requires handlings of the support plate and poses serious problems when this involves obtaining thicknesses of homogeneous insulants of about from 10 to 100 nm, this being the case when the Schottky or Poole-Frenkel thermoionic effect recommended in the document is used; in fact, the homogeneity of thickness, that of the dielectric and physical qualities and that of the porosity of the anodic oxide film depend on the uniformity of the current density during anodic oxidation; this density itself is a function of the relief of the sub-jacent films (point effects), the electrolyte used, its impureties, its temperature, the pH, agitation and ageing of the bath; in particular, any electrochemical impurety of the electrolyte, especially the anions contained in the bath, are likely to be trapped in the oxide, which results in risks of eletrical disruptive breakdown and conductive instabilities, finally, the conduction mechanism linked to the Schottky or Poole-Frenkel effects in the thick (10 to 100 nm) oxide films exponentially depends on the temperature, which renders it necessary to provide an accurate thermal adjustment of the final device, this adjustment proving to be delicate and expensive.

SUMMARY OF THE INVENTION

The object of the invention is to resolve these drawbacks. To this end, the invention offers a method to produce particularly simple MIM components and which, when used to embody a display screen, merely requires two masking levels. The method resolves all the difficulties linked to anodization and results in a conductive phenomenon almost insensitive to temperature and luminosity.

According to the invention, the method is effected via the mutual oxidation-reduction of two materials put into contact with each other.

More precisely, the object of the present invention is to provide a method to embody a display screen including a transparent insulating substrate supporting addressing columns, a matrix of electrodes and a matrix of switching elements, each switching element being constituted by at least one MIM component disposed between one addressing column and one electrode, this method being characterized by the fact that in order to embody the MIM components:

at the locations of the future MIM components, a stacking is formed on the substrate, said stacking including a first material, namely an oxidizing conductor, and a second material, namely an oxidizable conductor, this stacking is heated to a temperature of between 200° C. and 700° C., which creates a film of oxide between the two materials, the stacking is cooled to ambient temperature.

Such a method avoids the drawbacks of the prior art and has a large number of advantages:

the thickness of the insulating interface film is controlled in a way able to be reproduced by means of merely controlling the temperature and duration of the oxidation-reduction process between the two materials;

the interface oxide film obtained may easily be adjusted to a thickness of about from 5 to 10 nm so that the effect implemented is no longer a Schottky or Poole-Frenkel type effect but is a tunnel type effect; in these conditions, the current is virtually insensitive to temperature; moreover, it is insensitive to light; the flat screens obtained according to the invention may thus be used in a harsh environment and, for example, for the projection of large images;

the height of the "tunnel barrier" may be adjusted via the choice of materials; the placing in series of several MIMs makes it possible to adjust the equivalent width of the barrier; the adjustment of the height and total width of the tunnel barrier makes it possible to control the current/voltage characteristics of the MIMs and to optimize control currents and voltages.

the placing in series of the MIM components is extremely simple to implement and makes it possible to completely symetrize the voltage/current characteristics of the device;

the homogeneity of the thickness of the oxidizable and oxidizing material films, either within a given MIM or from one MIM to another, is not crucial as the phenomenon resulting in the formation of the oxide film occurs at the interface of the two films and not in volume;

the method of the invention may be implemented irrespective of the size of the screen as the MIMs are obtained automatically; in particular, it may be used for extremely large screens, which is not possible for the TFT or electrolyte methods described earlier; the technical means to be implemented are simple and in particular do not require any clean room; in other words, the technology used is less costly and may be qualified as "unsophisticated";

there is no risk of pollution of the insulant occuring as the latter is formed in situ without ever being exposed to the atmosphere; the oxidizing element is internal to the system of the two materials;

there is a physico-chemical continuity throughout the entire MIM component and no superimposition of films, as in the prior art, which avoids many of the drawbacks linked to the superimposing of various materials and in particular avoids the problems of adherence between films.

It ought to be mentioned that the formation of a thin film of oxide between an oxidizing conductor and an oxidizable conductor by raising the temperature is not a new physical phenomenon in itself. It is mentioned, for example, in the article by AKIO MIMURA et al. mentioned earlier. However, it is essential to stress that this phenomenon has never been used to form an active matrix display screen with MIM components. In the article referred to, if the phenomenon in question is mentioned, this is merely to underline its defective nature and one is strongly recommended to avoid using it. More precisely, the structure mentioned in the document referred to is not a MIM structure but a TFT structure. An ohmic contact needs to be formed on the doped silicon source n of the TFT and this contact is obtained by the depositing of ITO. The authors when forming this contact have stated that, with an annealing temperature in excess of 200° C. (and being established at 400° or 600° C., for example), an interposed film of oxide was formed between the ITO and the silicon. With this film destroying the ohmic nature of the contact sought-for, it was necessary to avoid this by keeping the temperature at a value of less than 200° C. This is also the reason why the silicon must strictly be initially deposited on the insulating substrate as this depositing is carried out at a temperature much higher than 200° C. (at 900° C., for example). The ITO film is only then deposited below 200° C. If the order of the operations is inversed by firstly depositing the ITO so as to previously constitute a future source contact and by then depositing the silicon at 900° C., an insulating film would be created between the ITO and the silicon, which is precisely what the authors wanted to avoid. Consequently, a technician is still seeking to find in this technique a way to avoid forming an insulating film by operating at a reduced temperature. The invention thus goes against this prejudgment by recommending on the contrary the formation of this oxide film by rising the temperature. The screen is no longer a TFT screen but, more advantageously, an MIM screen. Furthermore, there is nothing prohibiting inverting the order of the depositings, that is of firstly depositing the conductive oxide and then that of the seminconductor which, in certain cases, may prove to be advantageous.

There is also a further advantage of the invention linked to the control time of the screen. The applicant has observed that in the case where the oxidizable conductor was a semiconductor, such as silicon, the formation of an oxide film was accompanied by the appearance of a space charge region at the semiconductor/insulant interface. The aim of this space charge is to create a second capacitor in series with the capacitor corresponding to the insulating film, which results in a significant reduction of the capacity of the unit with respect to the value which would be obtained if the oxidizable conductor were a metal one, for example. Now, it is known that in an active matrix screen, the capacity of the MIM component should normally be lower than the capacity of the pixel if it is desired that the charges defining the electric field controlling display are above all present on the pixel and not in the MIM component. Up until now, the capacity of the MIM component was about one third of the capacity of a pixel. With the method of the invention, the presence of the space charge reduces the capacity of the MIM component to a value equal to about one tenth of the capacity of the pixel, this proving to be much more favorable. Clearly, it is the pixel which offers the greatest capacitive contribution to the display screen.

For this reason, in a preferred variant, the invention recommends the use of a semiconductor as an oxidizable conductive material. This semiconductor may be silicon, germanium, a binary compound such as gallium arsenide or indium phosphorus, or a ternary compound (GaAlAs) or even a quaternary compound.

As for the oxidizing conductive material, this may be selected from the group of conductive metallic oxides, such as indium oxide ($In_2O_3$), tin oxide ($SnO_2$), indium and tin oxide (ITO), ($In_2O_3+SnO_2$), zinc oxide (ZnO), etc.

When not a semiconductor, the oxidizable conductive material may be selected from the group of oxide mixtures ($V_2O_5$—$P_2O_5$) ($V_2O_5$—PbO—$Fe_2O_3$), of Al, Ti, Ta, Ag, Cr, Cu, Mn, Mo etc., metals or from the group of oxidizable alloys.

In all cases, the temperature for forming the oxide needs to be more than 200° C. and generally less than 700° C., this thus being a low or average temperature technology. For example, for an aluminium/ITO/glass substrate unit, the temperature should preferably be about 350° C. For a polysilicon/ITO/glass/substrate unit, the temperature may be about 625° C. For the titanium/ITO pairing, the temperature may be about 520° C.

The thermal stage may be carried out under vacuum or in the presence of gas (argon, oxygen, for example). Its duration depends on the thickness of the desired insulating film. Generally speaking, this period lasts about 3 hours.

The thermal stage may be carried out after the stacking has been formed, but it may also be made during the formation of this stacking if the operation for depositing the films is carried out within the range required for oxidation-reduction.

The object of the invention is also to provide a method for embodying a dynamic RAM memory including a matrix of storage capacitors with addressing lines and addressing columns and a switching element disposed between each capacitor and one line and one column, said method characterized by the fact that in order to embody the switching elements:

a stacking is formed, said stacking including a first material, namely an oxidizing conductor, and a second material, namely an oxidizable conductor, this stacking is heated to a temperature of between 200° C. and 700° C., which creates the MIM components, the temperature obtained is brought back to ambient temperature.

BRIEF DESCRIPTION OF THE DRAWINGS

The characteristics of the invention shall appear more readily from a reading of the following description of embodiment examples, given by way of illustration and being in no way restrictive, with reference to the accompanying drawings in which:

FIG. 2A shows the first stages (a, b, c, d, e) of a first embodiment of a display screen.

DETAILED DESCRIPTION OF THE PREFERRED EMBODIMENTS

In the following description, it is supposed that the substrate is made of glass, that the conductive material is ITO (tin and indium oxide), and that the oxidizable material is silicon, doped or not doped. However, it goes without saying that this description is given purely by way of explanation and it is possible to use other materials or combinations of materials, as indicated earlier.

In the case envisaged, the insulating film of the MIM components then becomes the silica resulting from oxidation of the silicon by the ITO film.

Figure 2B:
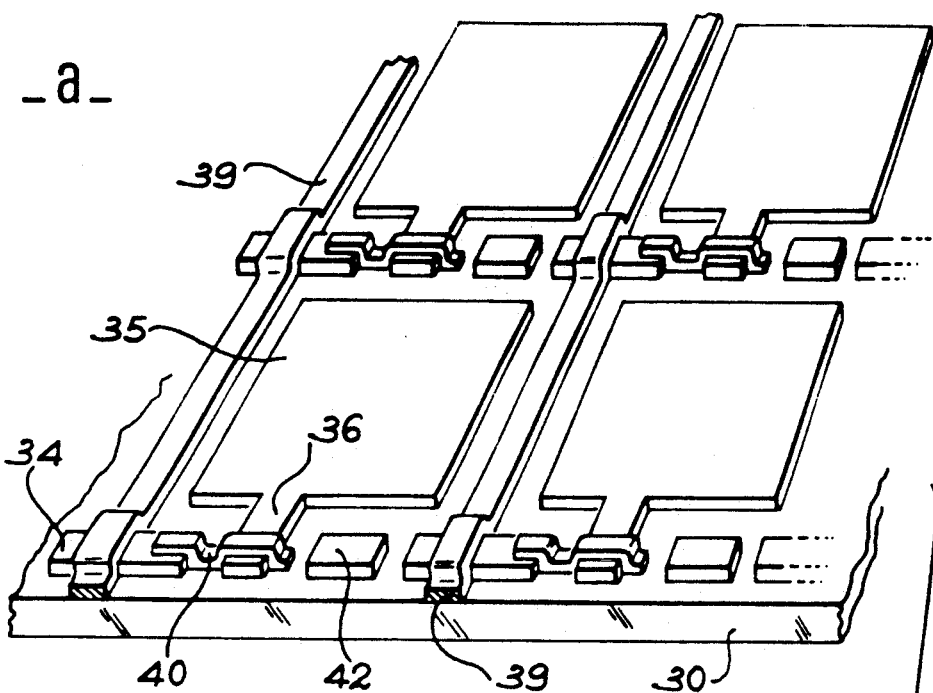
FIG. 2B shows the final stages (a, b, c) of this embodiment.
Figure 2B:
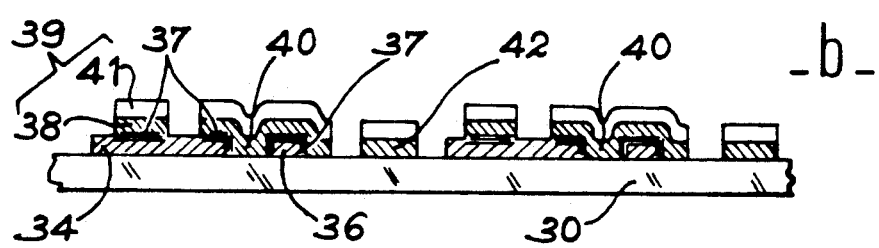
Figure 2B:
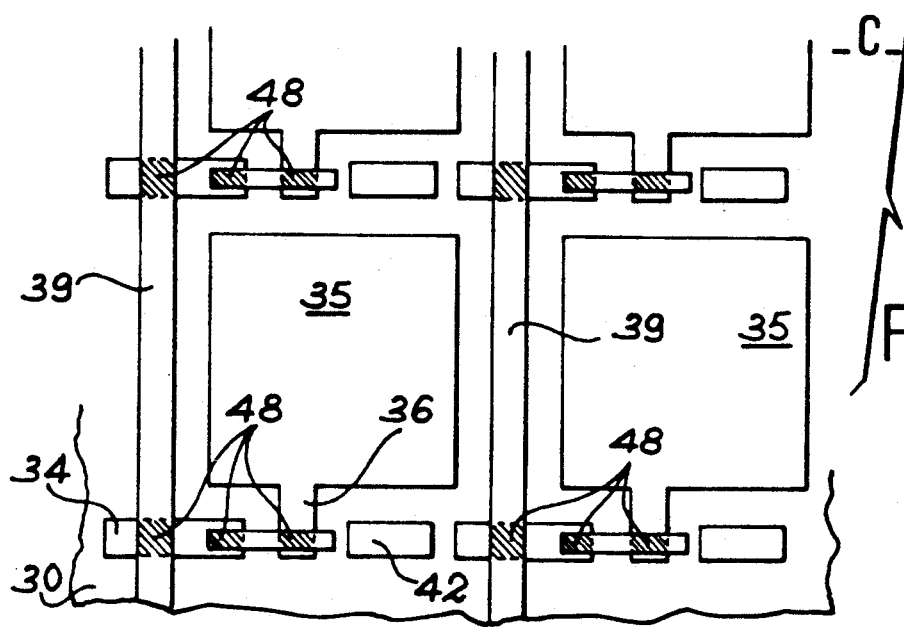

FIGS. 2A and 2B show the various stages for the embodiment of the plate which supports the matrix of pixels and the MIMs according to a first embodiment employing an oxidizing film situated below and an oxidizing silicon film situated above. In this respect, it will be observed that this disposition is the opposite of the one described in the document mentioned earlier, for those reasons already stated.

The various operations and stages are as follows:

FIG. 2A:
a: depositing of an ITO film 32 on a transparent insulating film,
b: photolithoengraving of a matrix of first connection patterns 34 and a matrix of electrodes 35 each having a piece joined on 36;
c: depositing of a silicon film 38 (dope or not) on the unit at 625° C.,
d: thermal stage at 625° C. so as to constitute, by means of oxidation-reduction between the silicon and the ITO, a film of silica 37,
e: subsequent depositing above the silicon a metal 41 (Al, W, Mo, etc); in the case where the electrical resistance is weak, this stage is not necessary.

FIG. B:
a: photolithoengraving of the metallic film 41, the silicon 38 and the silica 37 so as to form addressing columns 39 transversally overlapping one section of the first patterns 34 and second connection patterns 40 and longitudinally overlapping one section of the first patterns 34 and transversally the pieces joined on 36. The engraving may have blocks 42 constituting what is known as a "black matrix" designed to mask the addressing lines of the counter-electrode,
b, c: thus, three MIM devices are obtained in series at the locations marked with the reference 48. The metal 41 is merely used to short-circuit the intrinsic resistance of the silicon.

In this embodiment, the growth of the silica by oxidation-reduction between the silicon and the ITO may be obtained once the temperature for depositing the silicon is sufficient. Thus, the insulation of the future MIMs may be carried out during the stage 2Ac : the stage 2Ad is then a stage for ageing and homogenizing the MIM structures.

It can be observed that such a method only requires two masking levels and is accordingly extremely easy to implement, especially with large plates.

Figure 3A:
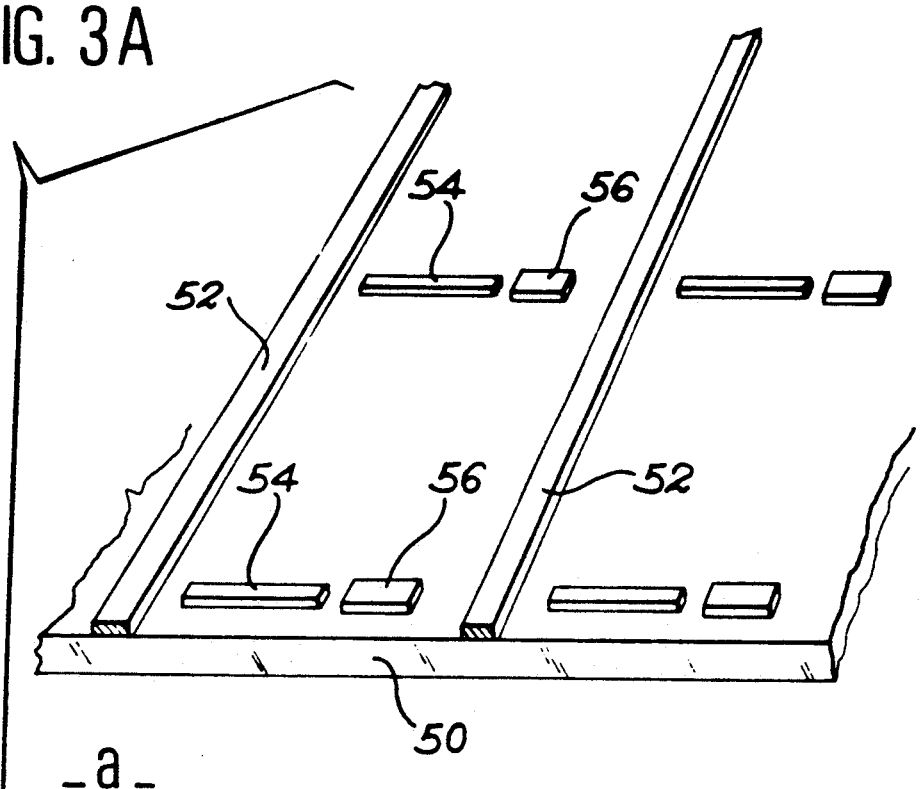
FIG. 3A shows the first stages (a, b) of a second embodiment of a display screen.
Figure 3A:
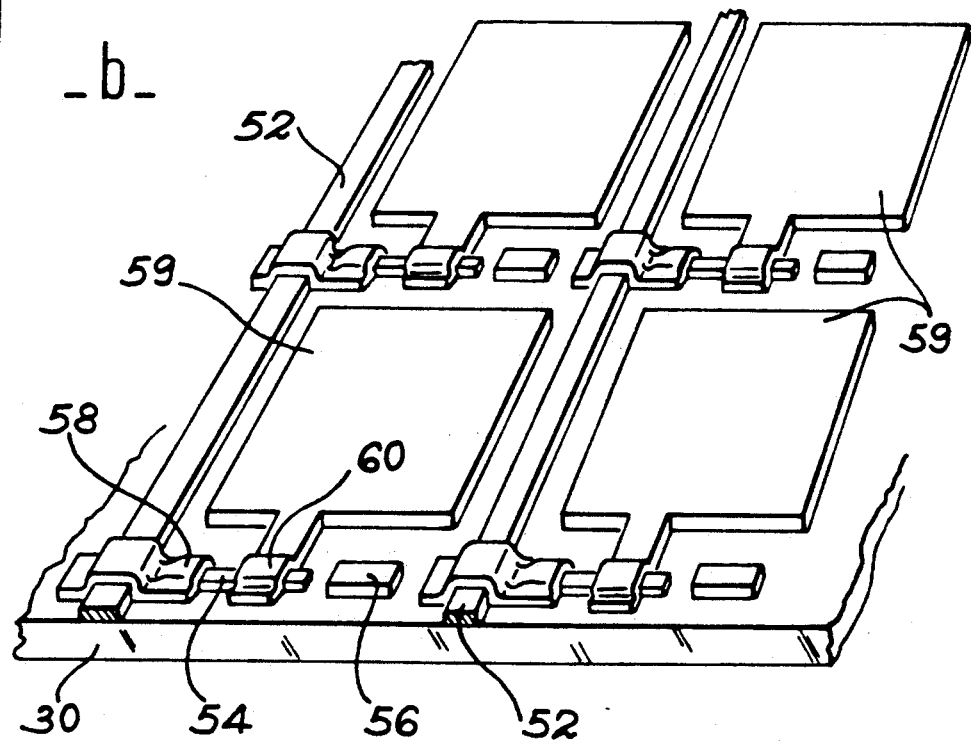
Figure 3B:
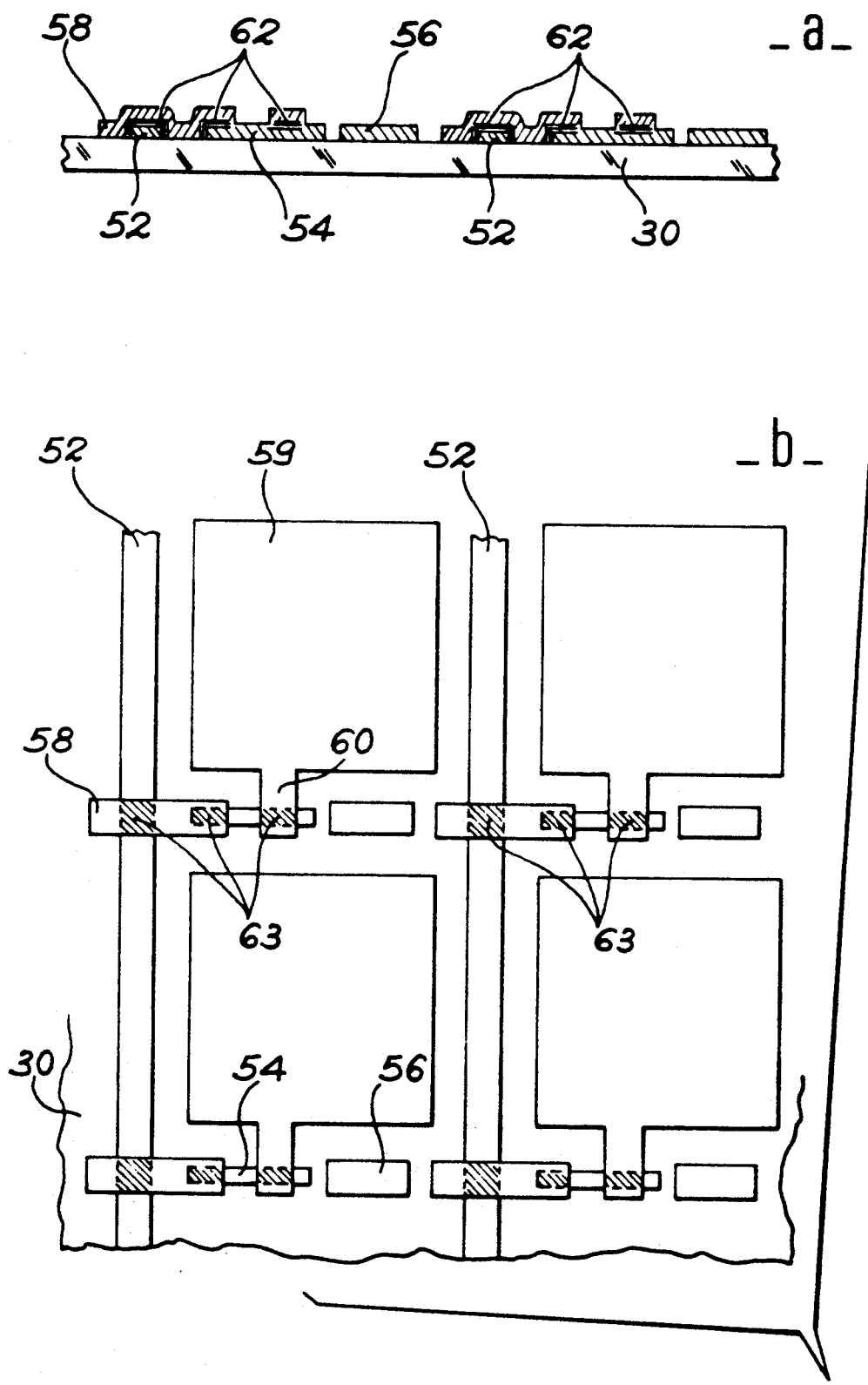
FIG. 3B shows the final stages (a, b) of this second embodiment.

In another embodiment, the order of the materials is inversed and first of all the oxidizable conductor is deposited followed by depositing the oxidizing conductor. This is shown on FIGS. 3A and 3B where the oxidizing material is ITO and the oxidizable material is tantalum. The stages and operations are as follows:

FIG. 3A:
a: a depositing onto a glass substrate 50 is made of a film of tantalum and photolithoengraving of the columns 52, the first connection patterns 54 and the blocks 56 of the "black matrix";
b: depositing of a film of ITO and engraving so as to form the second connection patterns 58 overlapping the columns 52 and one extremity of the first patterns 54 and so as to form a matrix of electrodes 59 with the pieces joined on 60 overlapping the patterns 54;

FIG. B:
a, b: thermal stage at about 475° C. so as to form the tantalum oxide ($Ta_2O_5$) 62 at the locations with the reference 63. Then a structure of three MIM devices is obtained in series between each column 52 and each electrode 59.

This method of embodiment only requires two photolithoengraving levels.

Figure 4:
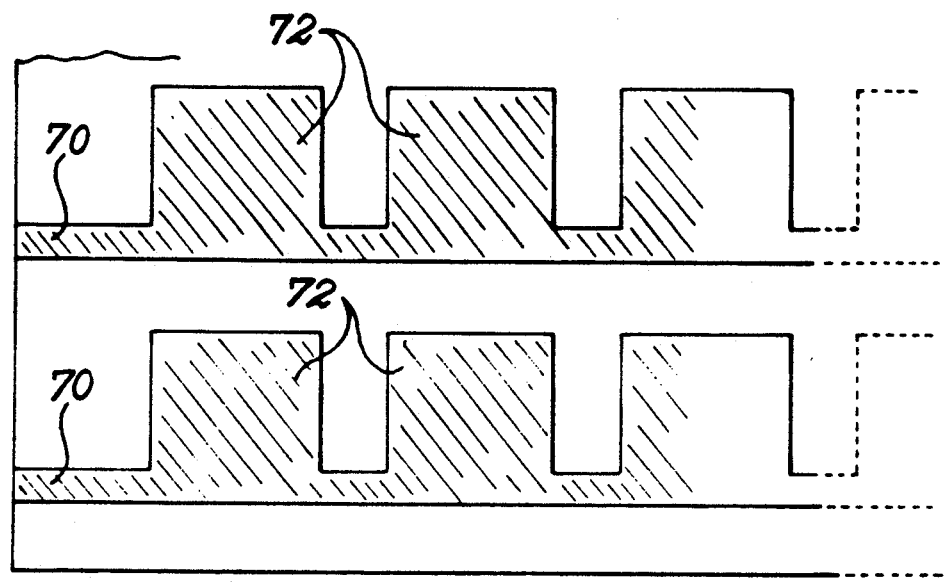
FIG. 4 shows the working of the tracks engraved on the backplate.

These operations (FIGS. 2A, 2B, 3A, 3B) make it possible to constitute the support plate of the matrix of electrodes and the row of addressing columns. It merely remains to embody the backplate with the counter-electrodes and the addressing lines. This backplate may be embodied by any known means, as illustrated on FIG. 4, by depositing on a glass plate a film of ITO followed by engraving so as to obtain lines 70 and counter-electrodes 72.

Emodiment of the screen is completed by spreading an orientation film ("surfactant") onto the two plates, the serigraphing of a glue wall onto the backplate, dispersing spacers, backplate/plate assembling and filling by a liquid crystal.

It is also possible to embody a color display screen by depositing onto the backplate colored filters, for example by electroplating ionized colored powders through the masks.

It will be observed that the lines and columns are on two different plates, which annuls the possibility of any short-circuit between these two addressing networks.

The invention is not limited to the embodiment of display screens. It can also be applied to the embodiment of components, such as dynamic RAM memories.

Figure 1:
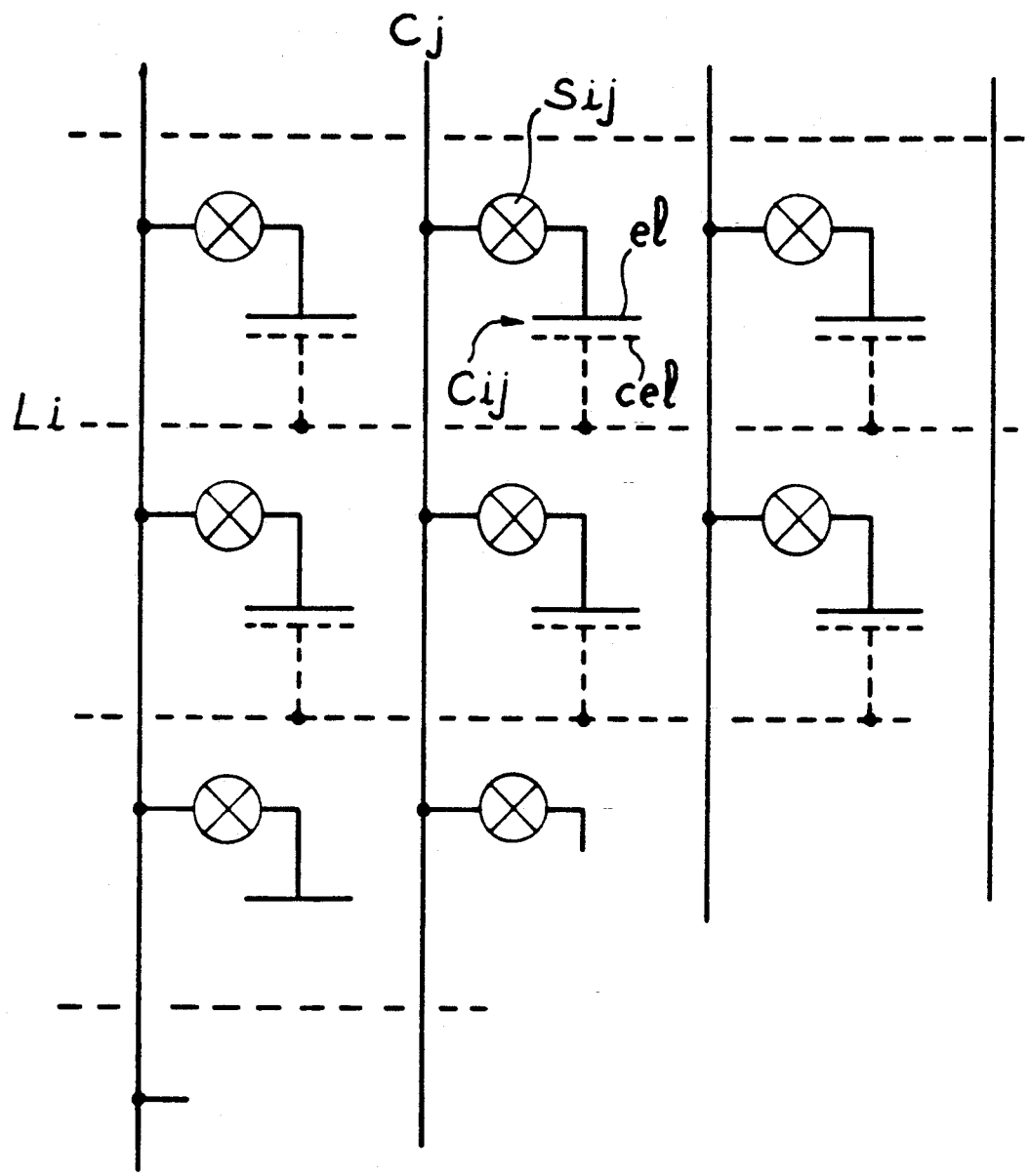
FIG. 1, already described, shows the general structure of an active matrix display screen with a MIM type non-linear element.
Figure 5A:
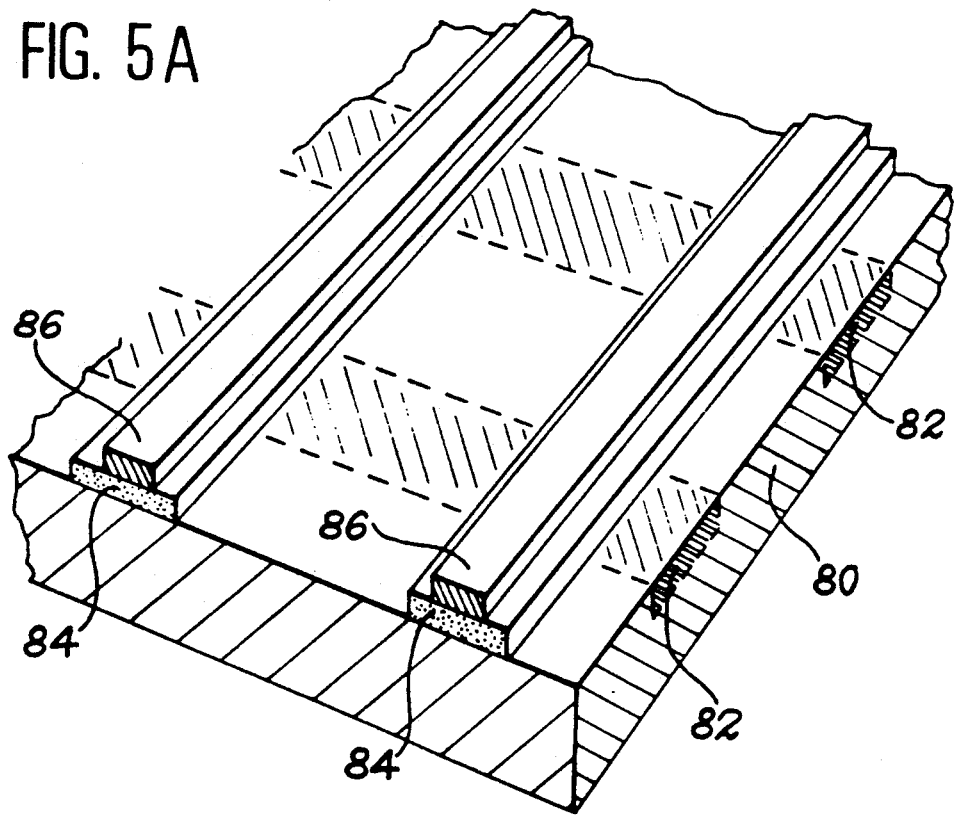
FIG. 5A illustrates a stage of the method for embodying a dynamic RAM memory.
Figure 5B:
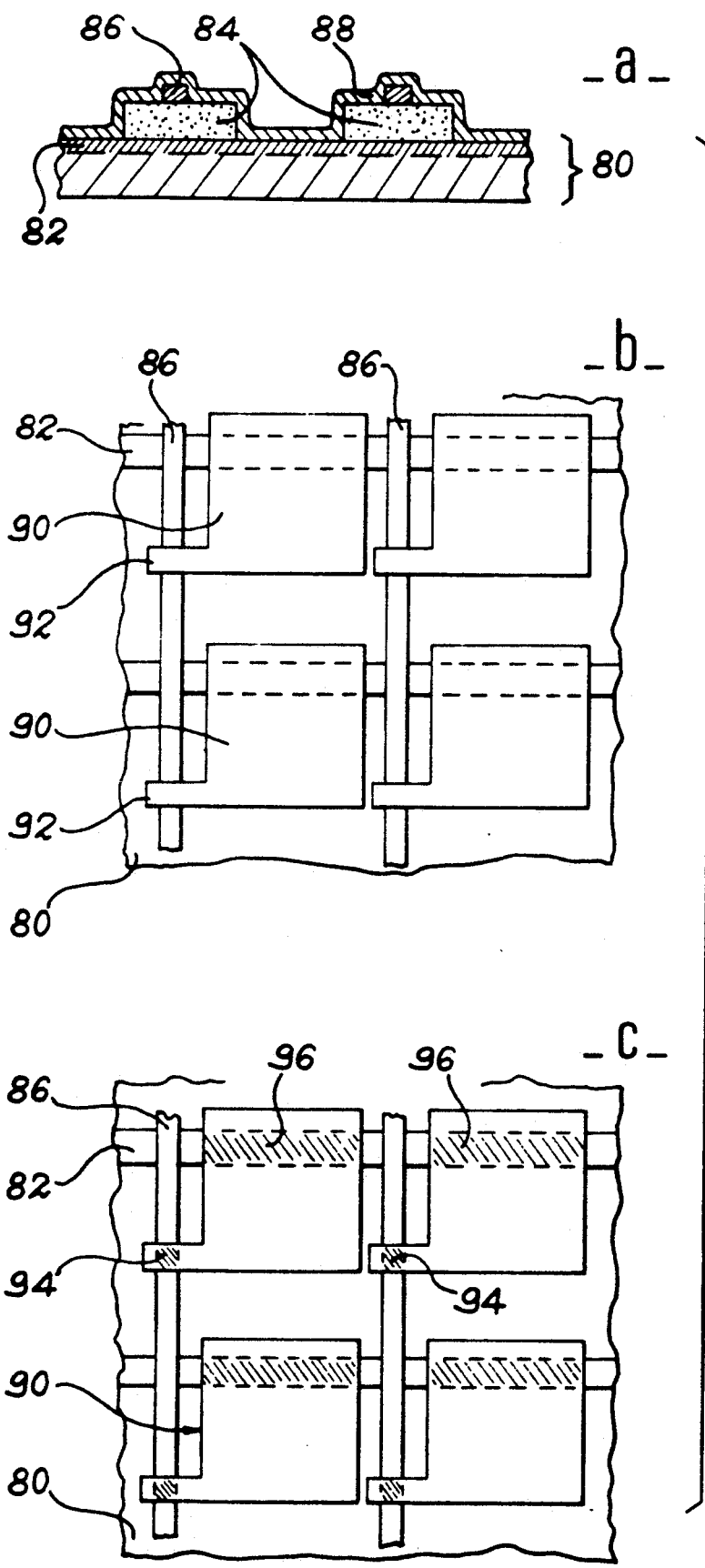
FIG. 5B illustrates the other stages of said method.

FIGS. 5A and 5B shown one example for embodying such a memory. Such a device is structurally comparable to the device of FIG. 1 if the addressing columns and lines are contained in or on the same semiconductive substrate. The operations may then be roughly the same as those described earlier if the various films no longer need to be transparent.

The various stages and operations may be as follows:

FIG. 5A:

doping a set of lines 82 into a semiconductor 80, such as silicon, depositing an insulating film and engraving of isolating columns 84, depositing an oxidizable film and engraving leaving addressing columns 86,

FIG. 5B:

a: depositing a film 88 of an oxidizing material, b: engraving so as to obtain a matrix of patterns 90 with pieces joined on 92 overlapping the columns 86, c: thermal stage so as to create the MIMs at the locations referenced 94, namely above the columns 86 and capacitors 96 above the lines 82.

It will be observed firstly that the MIM switches 94 and capacitors 96 created automatically and secondly the capacitors 96 formed above the doped silicon having an extremely thin insulating film or a high value make it possible to reduce the surface and thus increase integration density.

It is clear that it is possible to place in series any number of MIMs and thus adjust the values of the control currents and voltages.

What is claimed is:

1. A method for embodying a display screen comprising the steps of:

depositing onto a transparent insulating plate a first film made of a conductive metal oxide;

etching said first film so as to form a matrix of electrodes with a piece joined on and a matrix of first connection patterns at the location of future addressing columns;

depositing a second film made of a conductive oxidizable material;

heating said substrate with said etched first film and said second film to a temperature between 200° and 700° C. for forming a third film between said first and second films, said third film being made of an oxide of said oxidizable material;

etching said second and third films for forming addressing columns overlapping said first connection patterns so as to form a matrix of second connection patterns overlapping said first connection patterns and said pieces joined on said electrodes; and, bringing back the temperature to ambient temperature.

2. A method for embodying a display screen comprising the steps of:

depositing onto a transparent insulating plate a first film made of an oxidizable conductive material;

etching said first film for forming columns and a matrix of first connection patterns;

depositing a second film made of a conductive metal oxide;

etching said second film for forming a matrix of second connection patterns overlapping each first connection patterns and each column and for forming a matrix of electrodes with a piece joined on overlapping said first connection patterns;

heating said substrate with said etched first and second films to a temperature between 200° and 700° C. for forming a third film between said first and second films, said third film being made of an oxide of said oxidizable material; and, bringing back the temperature to ambient temperature.

3. Method for embodying a dynamic random access memory comprising the steps of:

doping a semiconductive substrate so as to form a set of addressing lines;

depositing onto said substrate a first film made of an insulating material;

etching said first film for forming insulating columns;

depositing a second film made of a conductive oxidizable material;

etching said second film to leave addressing columns on said insulating columns;

depositing a third film made of a conductive metal oxide;

etching said third film for forming a matrix of patterns overlapping said addressing lines with a piece joined on overlapping said addressing columns;

heating the substrate with said first, second and third etched films to a temperature between 200° and 700° C. for forming a fourth film between said second and third films, said fourth film being made of an oxide of said oxidizable material; and, bringing back the temperature to ambient temperature.

4. A method according to any one of claims 1 to 3, wherein said conductive metal oxide is selected from the group consisting of indium oxide, tin oxide, indium and zinc oxide.

5. A method according to claim 4, wherein said conductive oxidizable material comprises a semiconductive material selected from the group consisting of silicon, germanium, binary, ternary and quaternary compounds.

6. A method according to claim 4, wherein said conductive oxidizable material is selected from the group consisting of Al, Ti, Ta, Ag, Cr, Cu, Mn and oxidizable alloys.

7. A method according to claim 6, wherein said conductive oxidizable material comprises a semiconductive material selected from the group consisting of silicon, germanium, binary, ternary and quaternary compounds.

8. A method according to any one of claims 1 to 3, wherein said conductive oxidizable material is selected from the group consisting of Al, Ti, Ta, Ag, Cr, Cu, Mn and oxidizable alloys.

9. A method according to claim 8, wherein said conductive oxidizable material comprises a semiconductive material selected from the group consisting of silicon, germanium, binary, ternary and quaternary compounds.

10. A method according to any one of claims 1 to 3, wherein said conductive oxidizable material comprises a semiconductive material selected from the group consisting of silicon, germanium, binary, ternary and quaternary compounds.

* * * * *